United States Patent
Tamai (10) Patent No.: US 10,008,823 B2
(45) Date of Patent: Jun. 26, 2018

(54) METHOD FOR MANUFACTURING LASER SCANNING UNIT, LASER SCANNING UNIT, AND IMAGE FORMING APPARATUS

(71) Applicant: KYOCERA Document Solutions Inc., Osaka-shi, Osaka (JP)

(72) Inventor: Hiroatsu Tamai, Osaka (JP)

(73) Assignee: KYOCERA Document Solutions Inc., Osaka-shi, Osaka (JP)

( * ) Notice: Subject to any disclaimer, the term of this patent is extended or adjusted under 35 U.S.C. 154(b) by 0 days. days.

(21) Appl. No.: 15/246,326

(22) Filed: Aug. 24, 2016

(65) Prior Publication Data

US 2017/0060019 A1    Mar. 2, 2017

(30) Foreign Application Priority Data

Aug. 27, 2015   (JP) ................. 2015-167983

(51) Int. Cl.
*G03G 15/00*  (2006.01)
*H01S 5/022*  (2006.01)
(Continued)

(52) U.S. Cl.
CPC ... *H01S 5/02252* (2013.01); *G03G 15/04072* (2013.01); *G03G 21/1666* (2013.01); *H01S 5/02256* (2013.01)

(58) Field of Classification Search
CPC ............ H01S 5/02252; H01S 5/02256; G03G 21/1666; G03G 15/04072
(Continued)

(56) References Cited

U.S. PATENT DOCUMENTS

| 2008/0159785 | A1 |   | 7/2008 | Nagase |
|---|---|---|---|---|
| 2012/0327164 | A1 | * | 12/2012 | Momoka ................. B41J 2/473 347/118 |
| 2013/0063798 | A1 |   | 3/2013 | Takamatsu |

FOREIGN PATENT DOCUMENTS

| JP | H08082760 A |   | 3/1996 |
|---|---|---|---|
| JP | 08184735 A | * | 7/1996 |

(Continued)

OTHER PUBLICATIONS

Machine translations of JP 08-184735 A and JP 11-134657 A.*

(Continued)

*Primary Examiner* — Walter L Lindsay, Jr.
*Assistant Examiner* — Ruth Labombard
(74) *Attorney, Agent, or Firm* — Alleman Hall Creaseman & Tuttle LLP (57) ABSTRACT

A flange portion of this semiconductor laser element is press-fitted, with a front face of the semiconductor laser element serving as the leading head, into an externally-contacting hole portion of a through-hole in a vertical wall portion. The externally-contacting hole portion contacts an outer peripheral surface of the flange portion. A collimator lens is mounted to a support body before or after the flange portion is press-fitted into the externally-contacting hole portion. The press-fitting of the flange portion into the externally-contacting hole portion is stopped at a position where an edge portion, of the flange portion, on the front face side of the semiconductor laser element rests within the externally-contacting hole portion. The collimator lens is mounted to the support body in a path of emitted light in front of the semiconductor laser element.

6 Claims, 8 Drawing Sheets

(51) Int. Cl.
*G03G 15/04* (2006.01)
*G03G 21/16* (2006.01)

(58) Field of Classification Search
USPC .................................................... 399/4, 177
See application file for complete search history.

(56) References Cited

FOREIGN PATENT DOCUMENTS

| | | | |
|---|---|---|---|
| JP | 11134657 A | * | 5/1999 |
| JP | 2004266593 A | | 9/2004 |
| JP | 2008211039 A | | 9/2008 |
| JP | 2008300591 A | | 12/2008 |
| JP | 2009292953 A | | 12/2009 |
| JP | 2012103318 A | | 5/2012 |
| JP | 201362390 A | | 4/2013 |

OTHER PUBLICATIONS

European Patent Office, Extended European Search Report Issued in Application No. 16185703.2, dated Dec. 23, 2016, Germany, 10 pages.

* cited by examiner

METHOD FOR MANUFACTURING LASER SCANNING UNIT, LASER SCANNING UNIT, AND IMAGE FORMING APPARATUS

INCORPORATION BY REFERENCE

This application is based upon and claims the benefit of priority from the corresponding Japanese Patent Application No. 2015-167983 filed on Aug. 27, 2015, the entire contents of which are incorporated herein by reference.

BACKGROUND

The present disclosure relates to a method for manufacturing a laser scanning unit, the laser scanning unit, and an image forming apparatus provided with the same.

In general, an electrophotographic type image forming apparatus includes a laser scanning unit which emits laser light for writing an electrostatic latent image on a surface of an image carrier. The laser scanning unit includes: optical components such as a semiconductor laser element and a collimator lens; and a support body which is made of a synthetic resin and to which the optical components are mounted.

SUMMARY

A method for manufacturing a laser scanning unit according to one aspect of the present disclosure includes the following components. The laser scanning unit includes a support body, a semiconductor laser element, a substrate, and a collimator lens. The support body is an integrally molded member made of a synthetic resin and has a vertical wall portion in which a through-hole is formed. The semiconductor laser element has a flange portion protruding outwardly from a body portion thereof. The manufacturing method includes press-fitting the flange portion, with a front face of the semiconductor laser element serving as a leading head, into an externally-contacting hole portion of the through-hole in the vertical wall portion from a first face side of the vertical wall portion, the externally-contacting hole portion being configured to come into contact with an outer peripheral surface of the flange portion. Further, the manufacturing method includes installing a terminal on a rear face side of the semiconductor laser element to the substrate. Further, the manufacturing method includes mounting the collimator lens to the support body before or after the flange portion of the semiconductor laser element is press-fitted into the externally-contacting hole portion. The press-fitting of the flange portion into the externally-contacting hole portion is stopped at a position where an edge portion, of the flange portion, on the front face side of the semiconductor laser element rests within the externally-contacting hole portion. The collimator lens is mounted to the support body in a path of emitted light in front of the semiconductor laser element.

A laser scanning unit according to another aspect of the present disclosure includes a support body, a semiconductor laser element, a substrate, and a collimator lens. The support body is an integrally molded member made of a synthetic resin and has a vertical wall portion in which a through-hole is formed. The semiconductor laser element is press-fitted in the through-hole in the vertical wall portion. The substrate is located on a first face side of the vertical wall portion, and a terminal on a rear face side of the semiconductor laser element is installed to the substrate. The collimator lens is mounted to the support body in a path of emitted light in front of the semiconductor laser element. The semiconductor laser element has a flange portion protruding outwardly from a body portion thereof. The through-hole in the vertical wall portion includes an externally-contacting hole portion configured to come into contact with an outer peripheral surface of the flange portion. The flange portion is press-fitted in the externally-contacting hole portion of the vertical wall portion in a state where an edge portion, of the flange portion, on a front face side of the semiconductor laser element rests within the externally-contacting hole portion. A step is formed on an inner surface of the externally-contacting hole portion, the step being generated as a result of the flange portion having been press-fitted, with a front face of the semiconductor laser element serving as a leading head, into the externally-contacting hole portion from the first face side of the vertical wall portion.

An image forming apparatus according to another aspect of the present disclosure includes the laser scanning unit, an image carrier, a developing device, and a transfer device. On the image carrier, an electrostatic latent image is formed by laser light outputted from the laser scanning unit. The developing device is a device configured to develop the electrostatic latent image into a toner image. The transfer device is a device configured to transfer the toner image to a sheet material.

This Summary is provided to introduce a selection of concepts in a simplified form that are further described below in the Detailed Description with reference where appropriate to the accompanying drawings. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

FIGS. 10A-10D show mounting methods of semiconductor laser elements according to comparative examples in an evaluation test, in which

DETAILED DESCRIPTION

Hereinafter, embodiments of the present disclosure will be described with reference to the accompanying drawings. The embodiments described below represent an exemplary implementation of the present disclosure, and the technical scope of the present disclosure is not limited to the embodiments described below.

[Image Forming Apparatus 10]

Figure 1:
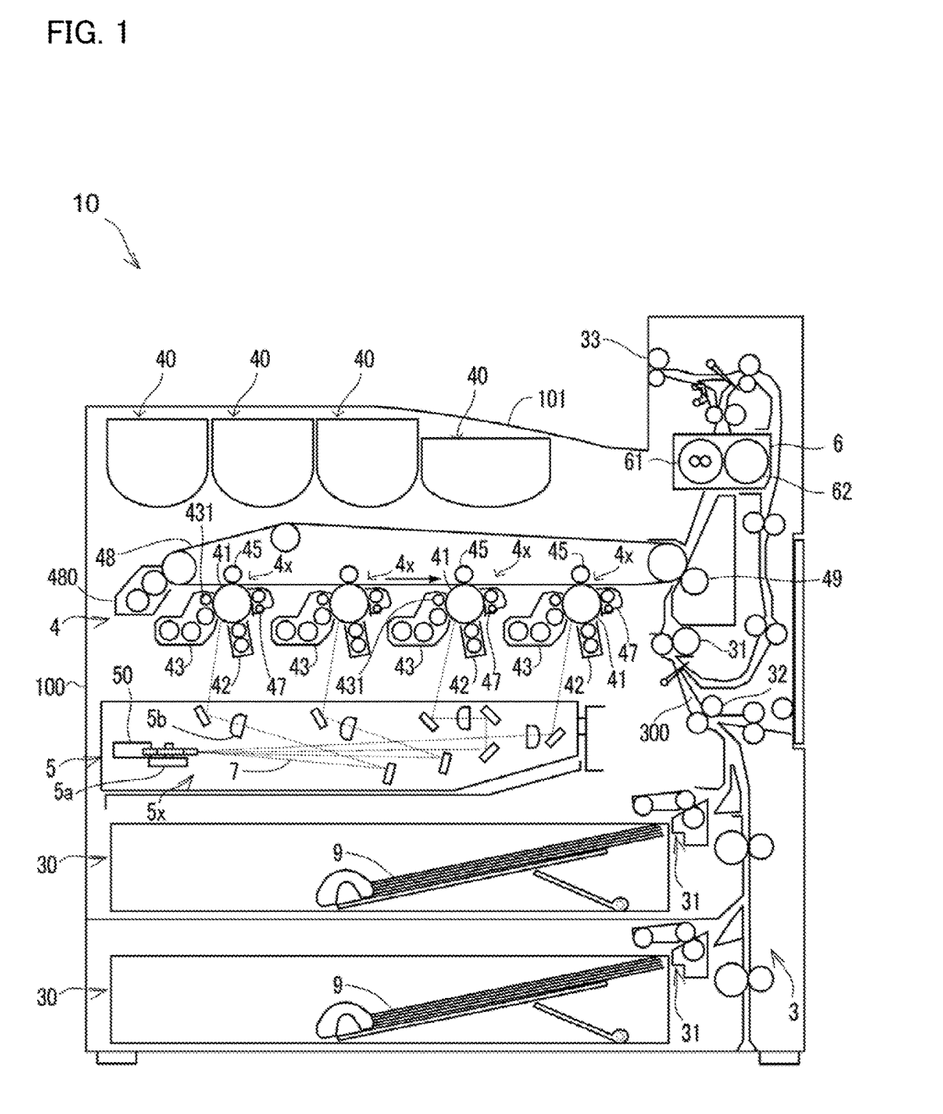
FIG. 1 is a configuration diagram of an image forming apparatus including a laser scanning unit according to an embodiment.

First, with reference to FIG. 1, a configuration of an electrophotographic type image forming apparatus 10 which includes a laser scanning unit 5 according to an embodiment will be described. The image forming apparatus 10 shown in FIG. 1 is a printer. The image forming apparatus 10 may be a copy machine, a facsimile apparatus, a multifunction peripheral, or the like.

The image forming apparatus 10 is an apparatus which forms, on a sheet material 9, an image based on print job data received from a terminal apparatus not shown. The sheet material 9 is a sheet-like medium on which an image is to be formed, such as paper, coated paper, a postcard, an envelope, or an OHP sheet.

The image forming apparatus 10 includes sheet storage portions 30, a sheet conveying portion 3, an image forming portion 4, the laser scanning unit 5, a fixing device 6, and the like. Each sheet storage portion 30 stores therein a plurality of stacked sheet materials 9.

In the sheet conveying portion 3, a sending-out roller 31 sends out the sheet material 9 from the sheet storage portion 30 to a sheet conveying path 300. Further, a conveying roller 32 conveys the sheet material 9 along the sheet conveying path 300. Further, a discharge roller 33 discharges the sheet material 9 on which an image has been formed, from the outlet of the sheet conveying path 300 onto a discharge tray 101.

The image forming portion 4 executes an image forming process of forming, on the sheet material 9, an image that corresponds to image data generated based on the print job data. The image forming apparatus 10 shown in FIG. 1 is a tandem-type image forming apparatus and is a color printer. Thus, the image forming portion 4 further includes an intermediate transfer belt 48, a secondary cleaning device 480, and a secondary transfer device 49.

The image forming portion 4 includes a plurality of single-color image forming portions 4x that correspond to the respective colors of cyan, magenta, yellow, and black. Further, the image forming apparatus 10 includes a plurality of toner supply portions 40 which respectively supply later-described developing devices 43 with toners of the respective colors of cyan, magenta, yellow, and black.

In the sheet conveying portion 3, the conveying roller 32 conveys the sheet material 9 via the secondary transfer device 49 to the discharge outlet of the sheet conveying path 300.

Each single-color image forming portion 4x includes: a photosensitive member 41 which carries a toner image; a charging device 42; a developing device 43; a primary transfer device 45; a primary cleaning device 47; and the like. The photosensitive member 41 is one example of an image carrier.

The photosensitive member 41 rotates, and the charging device 42 uniformly charges the surface of the photosensitive member 41. Further, the laser scanning unit 5 performs scanning with laser light 7, thereby writing an electrostatic latent image on the charged surface of the photosensitive member 41. The laser scanning unit 5 includes a scanner 5a such as a polygon mirror which performs scanning with the laser light 7. The laser scanning unit 5 also includes an fθ lens 5b and the like.

The laser scanning unit 5 includes: a light source unit 50 which outputs the laser light 7; a scanning unit 5x which includes a scanner 5a and the fθ lens 5b. The scanning unit 5x performs scanning with the laser light 7 outputted from the light source unit 50. The electrostatic latent image is formed on the surface of the photosensitive member 41 by the laser light 7 outputted from the laser scanning unit 5. The light source unit 50 and the scanning unit may be integrally formed.

The developing device 43 supplies the toner to the photosensitive member 41, thereby developing the electrostatic latent image into a toner image. The toner is supplied from the toner supply portion 40 to the developing device 43.

Further, the primary transfer device 45 transfers the toner image on the surface of the photosensitive member 41 to the intermediate transfer belt 48. The primary cleaning device 47 removes the toner remaining on the surface of the photosensitive member 41.

The intermediate transfer belt 48 is an endless belt-like member formed in a loop shape. The intermediate transfer belt 48 rotates in a state of being extended on and between two rollers. In the image forming portion 4, each single-color image forming portion 4x forms an image of its corresponding color on the surface of the rotating intermediate transfer belt 48. Accordingly, a color image in which images of the respective colors are superposed is formed on the intermediate transfer belt 48.

The secondary transfer device 49 transfers the toner image formed on the intermediate transfer belt 48, onto the sheet material 9. In the present embodiment, the primary transfer device 45, the intermediate transfer belt 48, and the secondary transfer device 49 represent one example of a transfer device which transfers the toner image on the photosensitive member 41 onto the sheet material 9.

The secondary cleaning device 480 removes the toner remaining on the portion, of the intermediate transfer belt 48, which has passed through the secondary transfer device 49.

The fixing device 6 sends out the sheet material 9 on which the image has been formed, while nipping the sheet material 9 between a heating roller 61 housing a heater and a pressure roller 62. By doing so, the fixing device 6 heats the toner on the sheet material 9 to fix the image on the sheet material 9.

[Light Source Unit 50]

Figure 2:
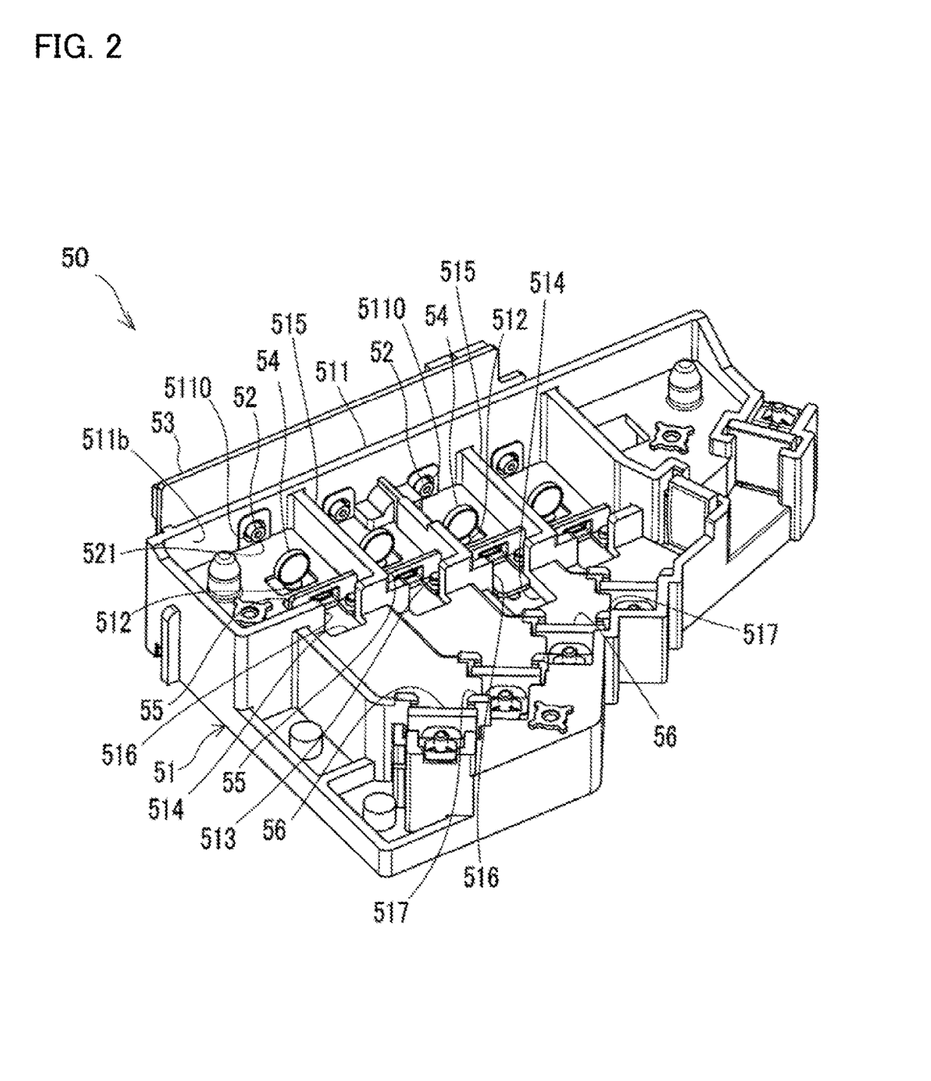
FIG. 2 is a first perspective view of a light source unit included in the laser scanning unit according to the embodiment.
Figure 3:
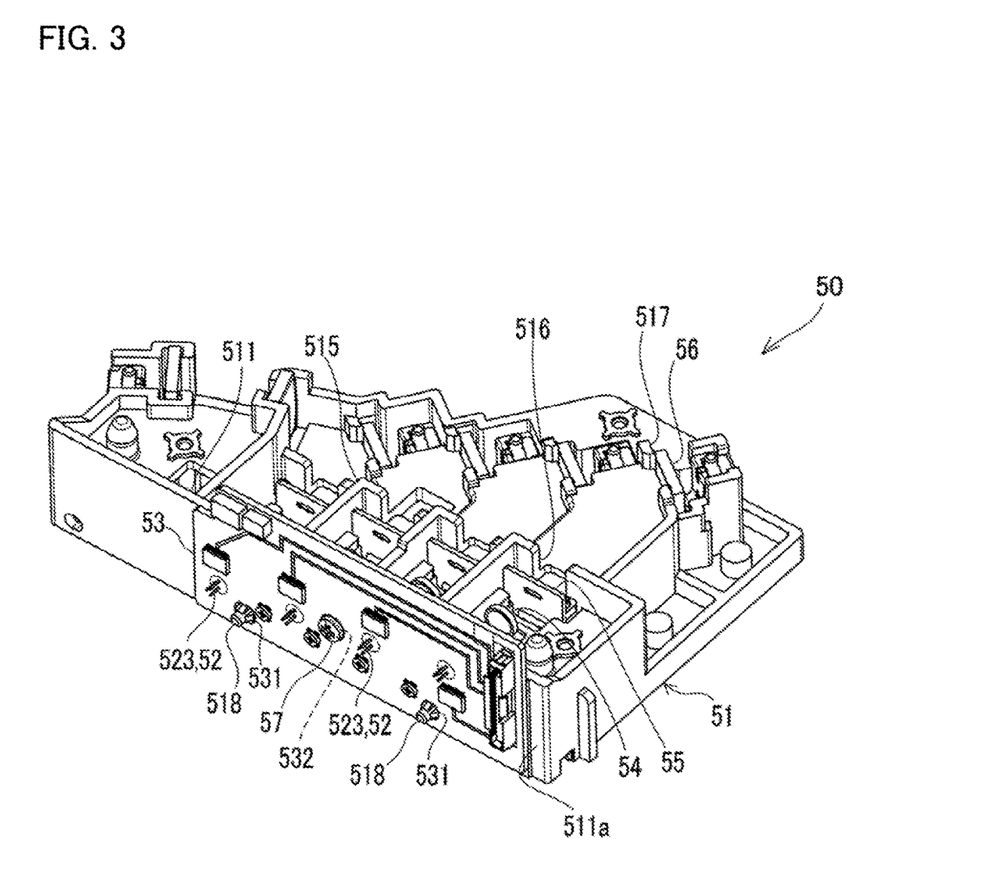
FIG. 3 is a second perspective view of the light source unit included in the laser scanning unit according to the embodiment.

Next, with reference to FIGS. 2 to 6, a configuration of the light source unit 50 will be described. FIGS. 2 and 3 are perspective views of the light source unit 50 viewed from different directions, respectively.

The light source unit 50 includes a support body 51, a semiconductor laser element 52, a substrate 53, a collimator lens 54, an aperture 55, a mirror 56, and the like.

The support body 51 is an integrally molded member made of a synthetic resin. For example, the support body 51 may be an integrally molded member which is made of a synthetic resin and in which polycarbonate (PC) and polystyrene (PS) are mixed.

The light source unit 50 includes a plurality of the semiconductor laser elements 52. Each of the semiconductor laser elements 52 outputs the laser light 7 for writing the electrostatic latent image in its corresponding color of cyan, magenta, yellow, or black.

Figure 6:
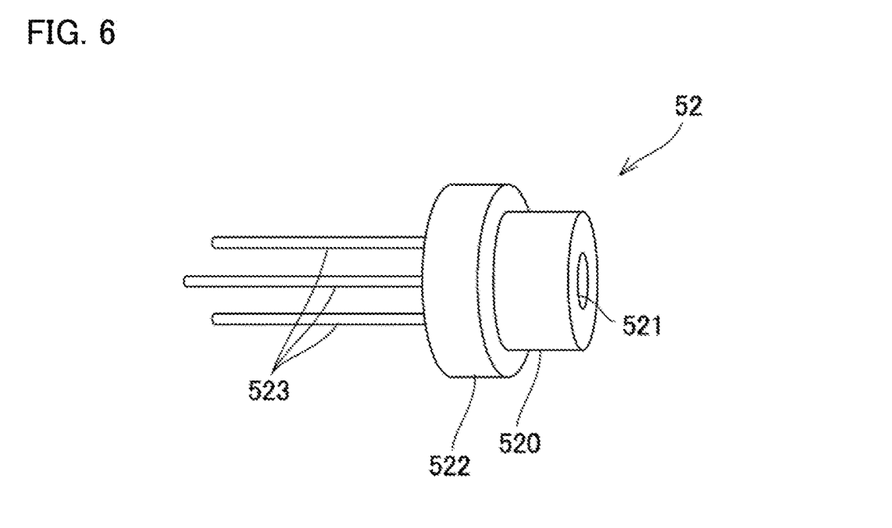
FIG. 6 is a perspective view of a semiconductor laser element.

FIG. 6 is a perspective view of the semiconductor laser element 52. The semiconductor laser element 52 includes a body portion 520, a flange portion 522, and terminals 523. A light emission hole 521 through which the laser light 7 is emitted is formed on the front face side of the body portion 520. The exterior members of the body portion 520 and the flange portion 522 are metal members.

In the semiconductor laser element 52, the flange portion 522 is a portion that protrudes outwardly from the body portion 520. In the present embodiment, the outer peripheral surface of the body portion 520 and the outer peripheral surface of the flange portion 522 are each in a cylindrical shape. The terminals 523 are formed so as to protrude on the rear face side of the semiconductor laser element 52.

Figure 4:
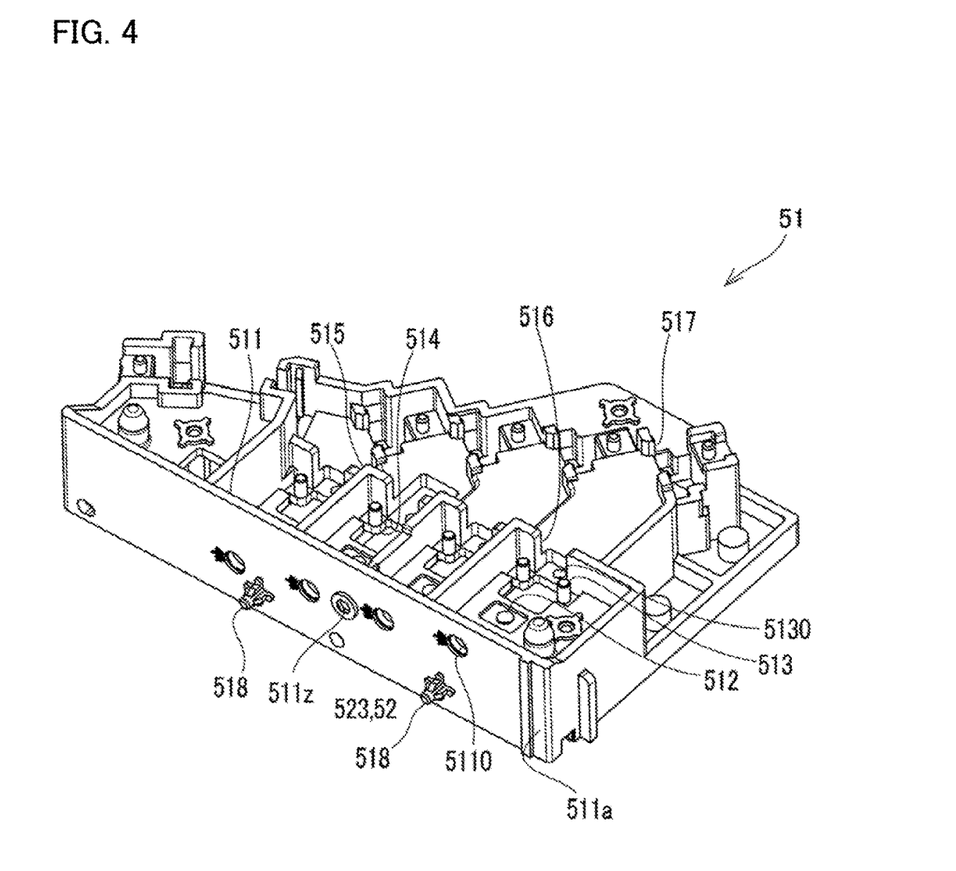
FIG. 4 is a perspective view of a support body included in the light source unit.

The support body 51 includes a vertical wall portion 511 in which through-holes 5110 are formed (see FIGS. 2 to 4). In the example shown in FIG. 4, the vertical wall portion 511 is a flat-plate-shaped portion that stands along the outer edge of the support body 51. Each semiconductor laser element 52 is press-fitted in its corresponding through-hole 5110 in the vertical wall portion 511.

The substrate 53 is an electronic substrate to which the terminals 523 on the rear face side of each semiconductor laser element 52 are connected. The substrate 53 is located on a first face 511a side of the vertical wall portion 511. The first face 511a of the vertical wall portion 511 is the outer face of the support body 51. A second face 511b which is on the opposite side to the first face 511a of the vertical wall portion 511 is the inner face of the support body 51.

In the example shown in FIG. 4, two protruding portions 518 are formed on the first face 511a of the vertical wall portion 511. Further, in the vertical wall portion 511, a screw hole 511z into which a screw 57 is screwed from the first face 511a side is formed.

As shown in FIGS. 3 and 4, the two protruding portions 518 on the vertical wall portion 511 are respectively fitted in two first through-holes 531 formed in the substrate 53. Further, a screw 57 is inserted into a second through-hole 532 formed in the substrate 53, to be screwed into the screw hole 511z in the vertical wall portion 511. Accordingly, the substrate 53 is mounted to the support body 51.

When the substrate 53 is to be mounted to the support body 51, the terminals 523 of each semiconductor laser element 52 pass through an installation hole in the substrate 53. Then, the terminals 523 of the semiconductor laser element 52 are fixed to the substrate 53 by soldering or the like.

The collimator lens 54 is mounted to the support body 51 in the path of the laser light 7 emitted by the semiconductor laser element 52. A plurality of the collimator lenses 54 are mounted to the support body 51 at positions in front of the respective semiconductor laser elements 52 mounted to the vertical wall portion 511.

That is, each collimator lens 54 is mounted at a position on the second face 511b side of the vertical wall portion 511 in the support body 51.

In the present embodiment, a seat 512 is formed at the position in the support body 51 where each collimator lens 54 is mounted. The collimator lens 54 is bonded to the seat 512 with an adhesive agent in a state of standing in front of the semiconductor laser element 52.

The aperture 55 is mounted to the support body 51 in the path of the laser light 7 that has passed through the collimator lens 54. A plurality of the apertures 55 are mounted to the support body 51 at positions in front of the respective semiconductor laser elements 52 and beyond the collimator lenses 54.

Figure 5:
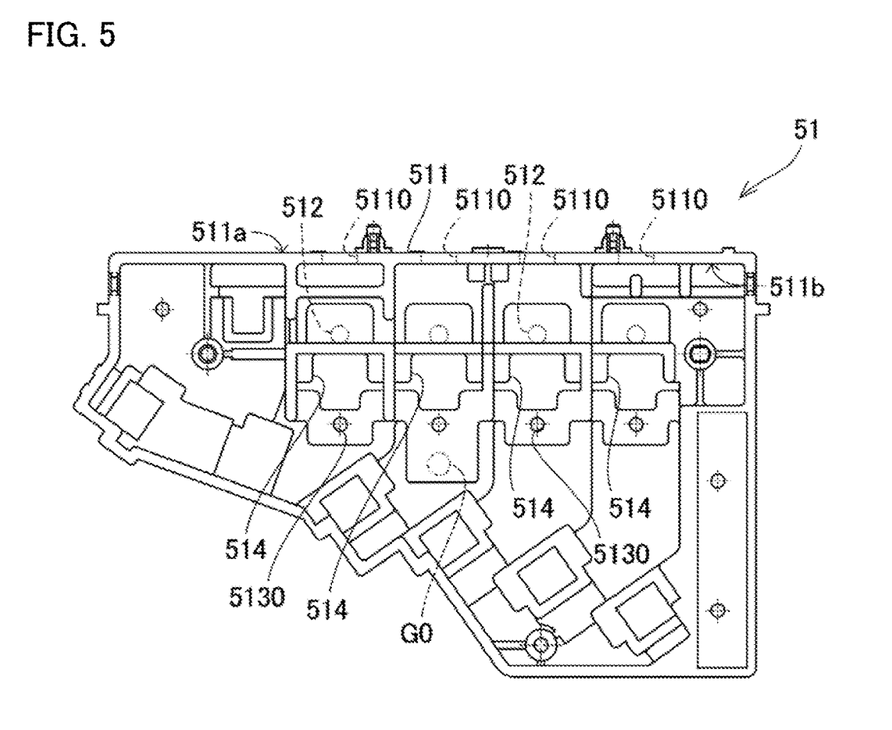
FIG. 5 is a bottom view of the support body included in the light source unit.

In the present embodiment, at the position in the support body 51 where each aperture 55 is mounted, a pair of protruding portions 513 and a through-hole 5130 are formed (see FIGS. 2, 4, and 5). The pair of protruding portions 513 are fitted in a pair of holes formed in a seat portion of the aperture 55, and a protrusion formed in the seat portion of the aperture 55 is fitted in the through-hole 5130 in the support body 51.

In the support body 51, partition walls 515 are formed which partition the peripheries of the portions in each of which the collimator lens 54 and the aperture 55 are mounted. In each partition wall 515, a cut-out portion 516 is formed which serves as the passage for the laser light 7 having passed through the aperture 55.

An opening 514 is formed in a portion, of the support body 51, on the opposite side to the vertical wall portion 511 side relative to the seat 512. In the support body 51, a plurality of the openings 514 are formed so as to correspond to the respective seats 512. As described above, each seat 512 is formed at the position in the support body 51 where the collimator lens 54 is mounted.

When the position and the orientation of the collimator lens 54 on the seat 512 are adjusted, a jig (not shown) holding the collimator lens 54 is passed through the opening 514. That is, the opening 514 is used in adjusting the mounting position of the collimator lens 54.

The pair of protruding portions 513 are formed on opposite sides of the opening 514, respectively. The aperture 55 is mounted to the support body 51 so as to extend across the opening 514.

FIG. 5 is a bottom view of the support body 51. The support body 51 is a member formed with a mold, with a position on the opposite side to the vertical wall portion 511 side relative to the openings 514 being set as the position for a resin flow-in gate G0. Thus, when the support body 51 is to be formed with a mold, the resin in a fluid state starts to flow from the position of the resin flow-in gate G0, goes around both sides of the region of the opening 514, and then, flows into the region extending from the seats 512 to the vertical wall portion 511.

The portion, of the support body 51, extending from the seats 512 to the vertical wall portion 511 is easy to be molded into a state of being easily shrinkable at an increased temperature, compared to the other portions of the support body 51.

The mirror 56 is mounted to the support body 51 in the path of the laser light 7 having passed through the collimator lens 54 and the aperture 55. A plurality of the mirrors 56 are mounted to the support body 51 at positions in front of the respective semiconductor laser elements 52 and beyond the collimator lenses 54 and the apertures 55. The laser light 7 is incident obliquely to the reflection surface of the mirror 56, to be reflected to another direction.

In the present embodiment, mirror receiving portions 517 are formed at positions in the support body 51 where the mirrors 56 are mounted, respectively. Each mirror 56 is fixed to the support body 51 with a screw or the like, in a state where the reflection surface of the mirror 56 is pushed against the mirror receiving portion 517. As a result of this, the mirror 56 is mounted to the support body 51 in a state where the reflection surface of the mirror 56 faces a predetermined direction.

In the present embodiment, the through-holes 5110 in the vertical wall portion 511 are formed at positions at different heights, respectively. That is, the respective semiconductor laser elements 52 are mounted at positions at different heights in the vertical wall portion 511.

The plurality of the laser lights 7 having been reflected at the respective mirrors 56 are arranged in a line in the vertical direction. To the support body 51, other optical devices are also mounted.

Meanwhile, the temperature around the light source unit 50 in the image forming apparatus 10 tends to be high due to heat generated by the semiconductor laser elements 52, heat generated by a heater of the fixing device 6, and the like. In addition, the support body 51, made of a synthetic resin, of the light source unit 50 could shrink and deform over time due to continuous use thereof in a high temperature environment.

In the image forming apparatus 10, if the support body 51 of the light source unit 50 shrinks, the distance from the semiconductor laser element 52 to the collimator lens 54 is decreased. Then, the focus position of the laser light 7 on the surface of the photosensitive member 41 changes, and such change in the focus position could cause deterioration of image quality.

On the other hand, in a case where the light source unit 50 is employed, even if the support body 51 made of a synthetic resin has shrunk over time, change in the focus position of the laser light 7 outputted by the light source unit 50 can be suppressed to the minimum level. This will be explained below.

[Mounting Structure for Semiconductor Laser Element 52]

Figure 7:
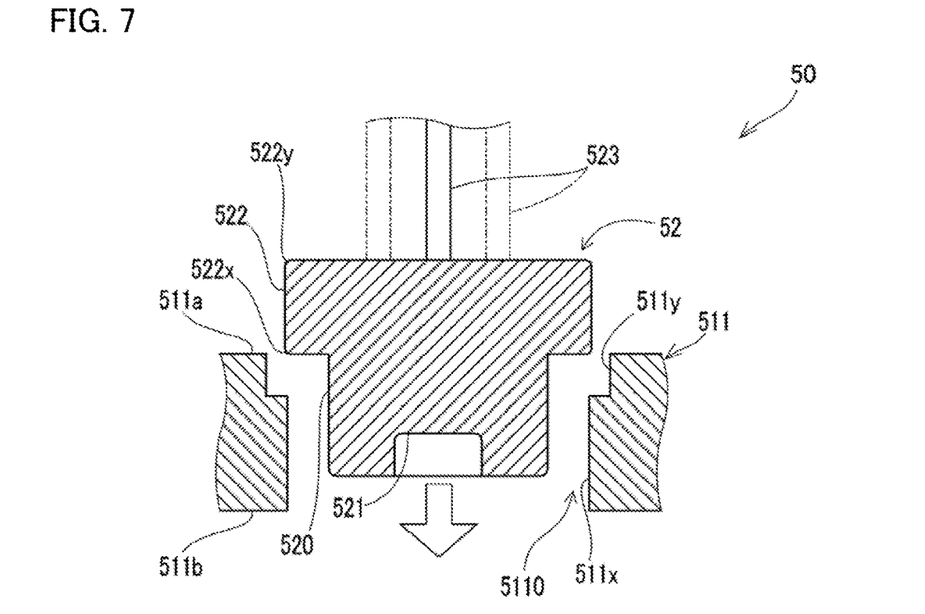
FIG. 7 is a cross-sectional view of a part of the support body of the light source unit included in the laser scanning unit according to the embodiment and the semiconductor laser element before being press-fitted into a through-hole in the support body.
Figure 8:
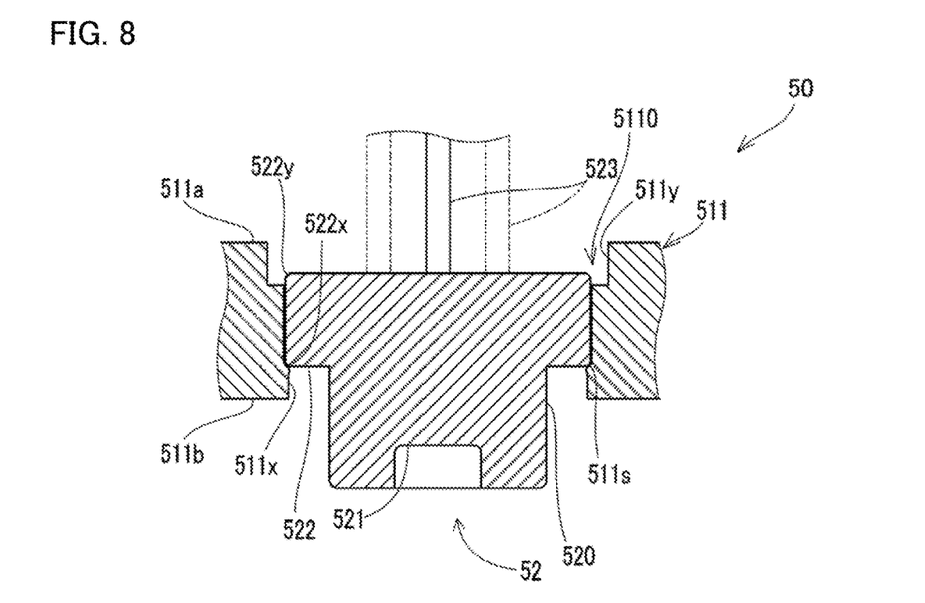
FIG. 8 is a cross-sectional view of a part of the support body of the light source unit included in the laser scanning unit according to the embodiment and the semiconductor laser element having been press-fitted in a through-hole in the support body.

Hereinafter, with reference to FIGS. 7 and 8, a mounting structure for the semiconductor laser element 52 will be described. FIGS. 7 and 8 are each a vertical cross-sectional view of the semiconductor laser element 52 and the portion of the through-hole 5110 in the support body 51 of the light source unit 50. FIG. 7 shows a state before the semiconductor laser element 52 is press-fitted into the through-hole 5110 in the support body 51. FIG. 8 shows a state where the semiconductor laser element 52 has been press-fitted in the through-hole 5110 in the support body 51.

The through-hole 5110 in the vertical wall portion 511 includes an externally-contacting hole portion 511x which comes into contact with the outer peripheral surface of the flange portion 522 of the semiconductor laser element 52. The transverse sectional shape of the inner peripheral surface of the externally-contacting hole portion 511x is analogous to the transverse sectional shape of the outer peripheral surface of the flange portion 522. In the present embodiment, the inner peripheral surface of the externally-contacting hole portion 511x is in a cylindrical shape.

In the present embodiment, a part on the first face 511a side of the through-hole 5110 in the vertical wall portion 511 is a guide-in hole portion 511y formed so as to have an inner diameter greater than the outer diameter of the flange portion 522.

As shown in FIG. 7, the flange portion 522 of the semiconductor laser element 52 is press-fitted, with the front face of the semiconductor laser element 52 serving as the leading head, into the externally-contacting hole portion 511x from the first face 511a side of the vertical wall portion 511.

In a state before the semiconductor laser element 52 is press-fitted into the externally-contacting hole portion 511x, the inner diameter of the externally-contacting hole portion 511x is slightly smaller than the outer diameter of the flange portion 522. The flange portion 522 made of a metal has a higher rigidity than the externally-contacting hole portion 511x made of a synthetic resin. Thus, when the flange portion 522 is pushed into the externally-contacting hole portion 511x, the portion, of the inner surface of the externally-contacting hole portion 511x, that comes into contact with the flange portion 522 is expanded to have the same diameter as the outer diameter of the flange portion 522.

In the description below, the edge portion, of the flange portion 522, on the front face side of the semiconductor laser element 52 will be referred to as a first edge portion 522x. The edge portion, of the flange portion 522, on the rear face side of the semiconductor laser element 52 will be referred to as a second edge portion 522y.

As shown in FIG. 8, the flange portion 522 is press-fitted into the externally-contacting hole portion 511x up to a middle position thereof, from the first face 511a side of the vertical wall portion 511. That is, the flange portion 522 is press-fitted in the externally-contacting hole portion 511x in a state where the first edge portion 522x of the flange portion 522 rests within the externally-contacting hole portion 511x.

Therefore, a small step 511s caused by the press-fitting of the flange portion 522 is formed on the inner surface of the externally-contacting hole portion 511x. The step 511s is formed at a portion, of the inner surface of the externally-contacting hole portion 511x, that is opposed to the first edge portion 522x of the flange portion 522. This step 511s is the evidence that the flange portion 522 has been press-fitted, with the front face of the semiconductor laser element 52 serving as the leading head, into the externally-contacting hole portion 511x from the first face 511a side of the vertical wall portion 511.

In the present embodiment, the second edge portion 522y of the flange portion 522 is located to the first face 511a side of the vertical wall portion 511 relative to the externally-contacting hole portion 511x. That is, the second edge portion 522y is exposed on the first face 511a side of the vertical wall portion 511, from the externally-contacting hole portion 511x.

[Method for Manufacturing Light Source Unit 50]

Figure 9:
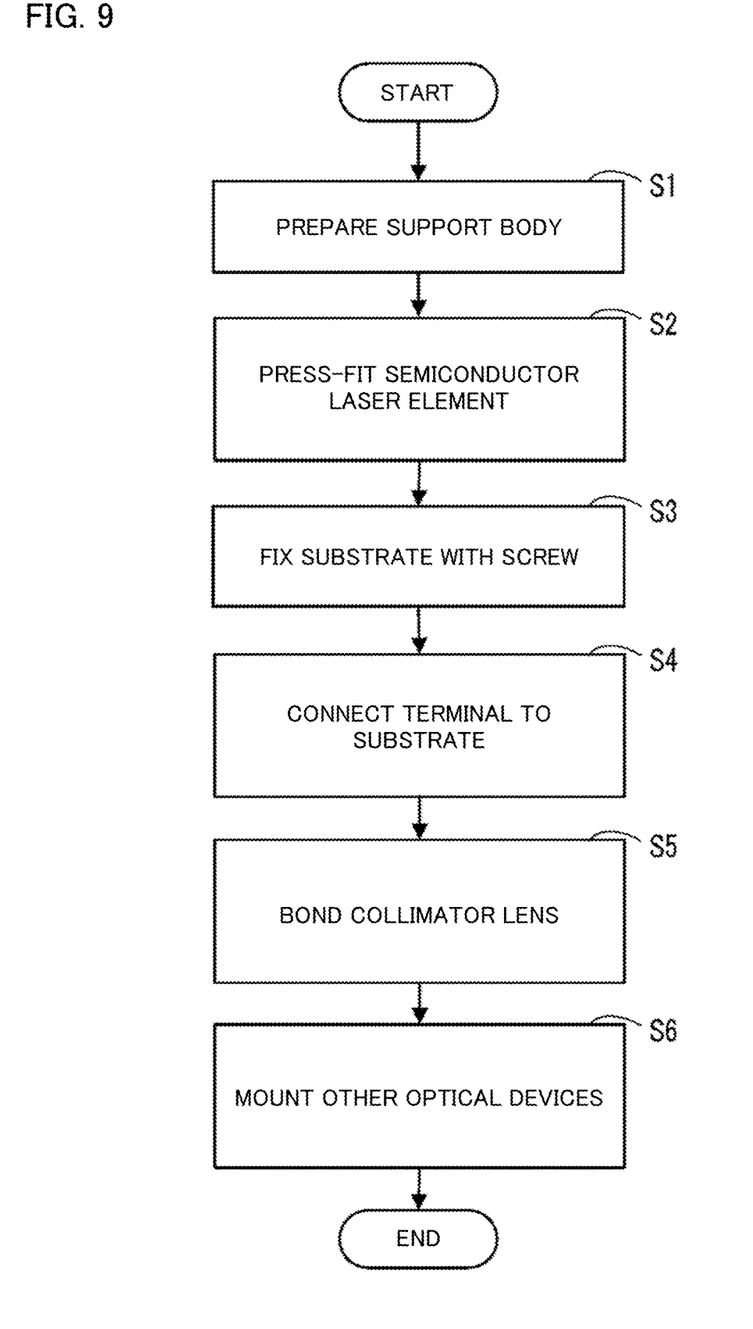
FIG. 9 is a flow chart showing one example of a manufacturing procedure of the light source unit included in the laser scanning unit according to the embodiment.

Next, with reference to the flow chart shown in FIG. 9, one example of the manufacturing procedure of the light source unit 50 will be described. In the description below, S1, S2, . . . respectively represent identification signs of assembling steps of the light source unit 50. The assembling steps of the light source unit 50 are steps of assembling components to the support body 51. The assembling steps of the light source unit 50 are part of a method for manufacturing the laser scanning unit 5.

<Step S1>

First, the support body 51 formed with a mold is prepared. As described above, in the support body 51, the vertical wall portion 511, the through-holes 5110, the seats 512, the openings 514, and the like are formed.

<Step S2>

Next, the flange portion 522 of each semiconductor laser element 52 is press-fitted into its corresponding externally-contacting hole portion 511x of the through-hole 5110 in the vertical wall portion 511 of the support body 51. At that time, the flange portion 522 is press-fitted, with the front face of the semiconductor laser element 52 serving as the leading head, into the externally-contacting hole portion 511x from the first face 511a side of the vertical wall portion 511 (see FIGS. 7 and 8).

In step S2, the press-fitting of the flange portion 522 into the externally-contacting hole portion 511x is stopped at a position where the first edge portion 522x of the flange portion 522 rests within the externally-contacting hole portion 511x. That is, the step of pushing the flange portion 522 into the externally-contacting hole portion 511x from the first face 511a side ends before the first edge portion 522x of the flange portion 522 passes through the externally-contacting hole portion 511x. Accordingly, the small step 511s is formed on the inner surface of the externally-contacting hole portion 511x (see FIG. 8).

In the present embodiment, the press-fitting of the flange portion 522 into the externally-contacting hole portion 511x is stopped at a position where the second edge portion 522y of the flange portion 522 does not reach the externally-contacting hole portion 511x. Thus, the second edge portion 522y of the flange portion 522 is located to the first face 511a side of the vertical wall portion 511 relative to the externally-contacting hole portion 511x.

<Step S3>

Next, the substrate 53 is mounted, on the first face 511a side, to the vertical wall portion 511 of the support body 51. In this step, the two protruding portions 518 of the vertical wall portion 511 are fitted into the two first through-holes 531 in the substrate 53, respectively (see FIG. 3). Accordingly, the position of the substrate 53 relative to the vertical wall portion 511 is fixed. At that time, the terminals 523 of each semiconductor laser element 52 pass through the installation hole in the substrate 53. Further, the substrate 53 is fixed, on the first face 511a side, to the vertical wall portion 511 with the screw 57 (see FIG. 3).

<Step S4>

Then, the terminals 523 on the rear face side of the semiconductor laser element 52 are connected to the wiring pattern of the substrate 53 by soldering.

<Step S5>

Further, each collimator lens 54 is mounted on the seat 512 in the support body 51. In the present embodiment, the collimator lens 54 is bonded to the seat 512 with an adhesive agent.

Further in this step, the position and the orientation of the collimator lens 54 are adjusted in a state where a jig (not shown) holding the collimator lens 54 is passed through the opening 514 of the support body 51. As a result of this, the collimator lens 54 is mounted to the support body 51, in the path of emitted light from the front face of the semiconductor laser element 52 on the second face 511b side of the vertical wall portion 511.

<Step S6>

Further, other optical devices such as the apertures 55 and the mirrors 56 are mounted to the support body 51.

Although the assembling steps of the light source unit 50 also include steps not described in the above, description thereof is omitted here.

In the assembling steps of the light source unit 50, one or both of the step (S5) of mounting each collimator lens 54 to the support body 51, and the step (S6) of mounting optical devices such as the apertures 55 to the support body 51 may be executed before the step (S2) of press-fitting the flange portion 522 into the externally-contacting hole portion 511x.

<Evaluation Test>

Next, with reference to FIGS. 10 and 11, a result of an evaluation test which was conducted for comparing the light source unit 50 with light source units of comparative examples will be described.

FIG. 10 shows mounting methods of the semiconductor laser elements 52 according to four comparative examples EX1 to EX4 in the evaluation test. In FIG. 10, each arrow indicates the direction along which the semiconductor laser element 52 is press-fitted.

Figure 10A:
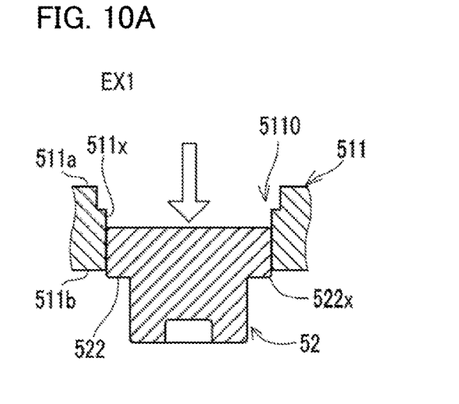
FIG. 10A shows First comparative example.

First comparative example EX1 is an example in which, as in the case of the light source unit 50, the flange portion 522 has been press-fitted, with the front face of the semiconductor laser element 52 serving as the leading head, into the externally-contacting hole portion 511x from the first face 511a side of the vertical wall portion 511.

However, in First comparative example EX1, the press-fitting of the flange portion 522 into the externally-contacting hole portion 511x is performed up to a position where the first edge portion 522x of the flange portion 522 passes through the externally-contacting hole portion 511x. As a result of this, the flange portion 522 is press-fitted in the externally-contacting hole portion 511x in a state where the first edge portion 522x of the flange portion 522 protrudes to the second face 511b side from the externally-contacting hole portion 511x.

Figure 10B:
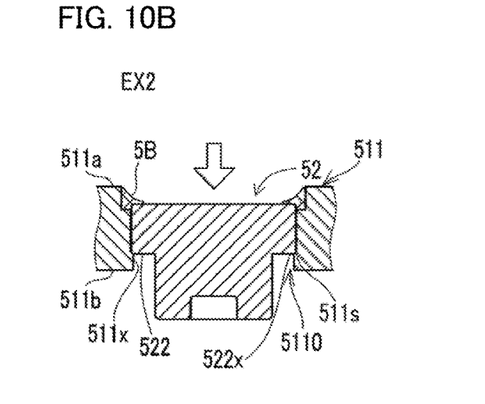
FIG. 10B shows Second comparative example.

Second comparative example EX2 is an example in which, as in the case of the light source unit 50, the flange portion 522 has been press-fitted, with the front face of the semiconductor laser element 52 serving as the leading head, into the externally-contacting hole portion 511x from the first face 511a side of the vertical wall portion 511.

Further, in Second comparative example EX2, the flange portion 522 is press-fitted in the externally-contacting hole portion 511x in a state where the first edge portion 522x of the flange portion 522 rests within the externally-contacting hole portion 511x. This point is also the same as in the case of the light source unit 50.

However, in Second comparative example EX2, the second edge portion 522y of the flange portion 522 is bonded to the vertical wall portion 511 with an adhesive agent 5B.

Figure 10C:
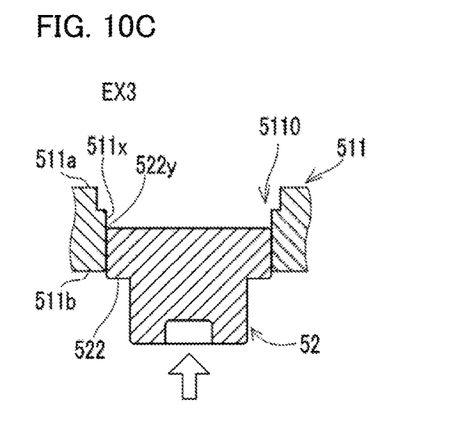
FIG. 10C shows Third comparative example.

Third comparative example EX3 is an example in which the flange portion 522 has been press-fitted, with the rear face of the semiconductor laser element 52 serving as the leading head, into the externally-contacting hole portion 511x from the second face 511b side of the vertical wall portion 511.

In Third comparative example EX3, the flange portion 522 is press-fitted in the externally-contacting hole portion 511x in a state where the second edge portion 522y of the flange portion 522 rests within the externally-contacting hole portion 511x.

Figure 10D:
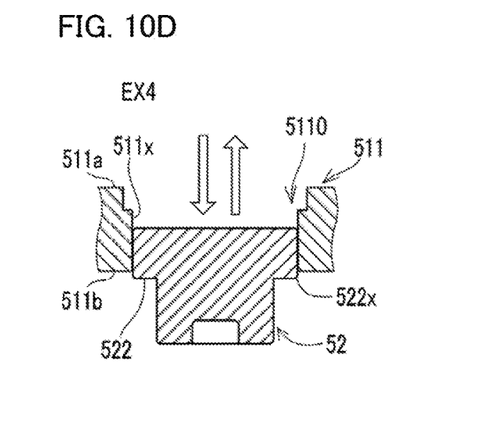
FIG. 10D shows Fourth comparative example.

Fourth comparative example EX4 is an example in which the step of press-fitting the flange portion 522 into the externally-contacting hole portion 511x has been executed a plurality of times, both in the direction from the first face 511a side to the second face 511b side of the vertical wall portion 511 and in the direction reverse thereto.

In Fourth comparative example EX4, when the flange portion 522 is press-fitted into the externally-contacting hole portion 511x from the first face 511a side of the vertical wall portion 511, the first edge portion 522x passes through the externally-contacting hole portion 511x. Similarly, when the flange portion 522 is press-fitted into the externally-contacting hole portion 511x from the second face 511b side of the vertical wall portion 511, the second edge portion 522y passes through the externally-contacting hole portion 511x. Then, the flange portion 522 is held at a position where the first edge portion 522x protrudes to the second face 511b side from the externally-contacting hole portion 511x.

Figure 11:
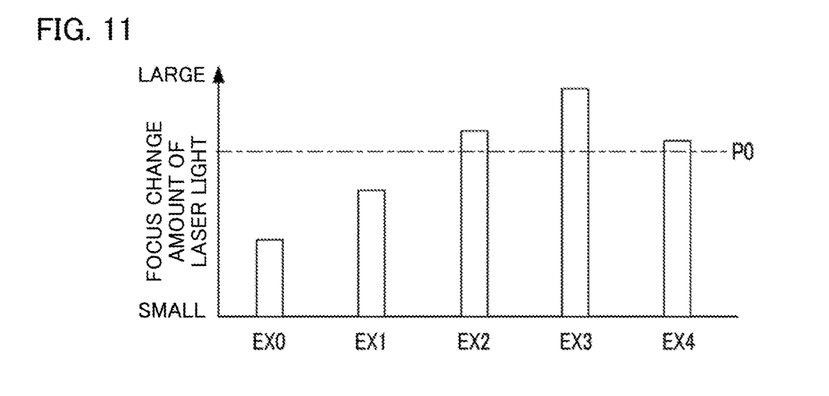
FIG. 11 is a graph showing a result of the evaluation test.

FIG. 11 shows a result of an evaluation test which was conducted regarding the light source unit 50 and the light source units of the respective four comparative examples EX1 to EX4. In FIG. 11, EX0 indicates the evaluation result of the light source unit 50.

The evaluation test is an acceleration test regarding use of the light source units in a high temperature environment. In the evaluation test, each light source unit is placed in a thermostat at 60° C. for 60 hours. As a result of this, shrinkage of the support body 51 occurs. Then, the focus change amount in the main scanning direction of the laser light 7 emitted by each light source unit is measured.

In the evaluation test, a longitudinal magnification α of the laser light 7 is 565. When the focal length relative to the collimator lens 54 is Fco, and the focal length of the fθ lens 5b is Fθ, the longitudinal magnification α can be calculated by applying Fco and Fθ to a formula $\alpha=(Fco/F\theta)^2$.

FIG. 11 shows a measurement result of the evaluation test. When the focus change amount exceeds a threshold value P0, visible deterioration appears on the image formed on the sheet material 9.

As shown in FIG. 11, the focus change amount in the comparative example EX1 is greater than that of the light source unit 50, but is smaller than the threshold value P0 at which image deterioration appears. On the other hand, the focus change amount of each of the comparative examples EX2 to EX4 is greater than the threshold value P0.

If the light source unit 50 is employed, even when the support body 51 made of a synthetic resin has shrunk over time in a high temperature environment, the focus change amount of the laser light 7 can be suppressed at a small level compared to those in the comparative examples EX1 to EX4.

In the light source unit 50, when the support body 51 has shrunk, the distance between the vertical wall portion 511 and the collimator lens 54 is reduced. It is estimated that, at that time, the semiconductor laser element 52 withdraws to the first face 511a side of the vertical wall portion 511 in the externally-contacting hole portion 511x, in response to the shrinkage of the support body 51.

The withdrawal of the semiconductor laser element 52 acts in the direction which allows the distance between the semiconductor laser element 52 and the collimator lens 54 to be kept constant. This fact is estimated to be the factor for the good result of the light source unit 50 in the evaluation test.

The greater the longitudinal magnification α of the laser light 7 is, the higher the sensitivity to the focus change of the laser light 7 is. For example, in a case where the longitudinal magnification α is 500, the focus change amount at the time when the distance between the semiconductor laser element 52 and the collimator lens 54 has changed by 1 micrometer is 5 times of that in the case where the longitudinal magnification α is 100. Thus, in such a case where the longitudinal magnification α exceeds 300, the effect realized by employing the light source unit 50 becomes more significant.

The method for manufacturing the light source unit, the light source unit, and the image forming apparatus according to the present disclosure can also be configured by freely combining the embodiment and application examples described above, or modifying or partially omitting the embodiment and application examples as appropriate, within the scope of the disclosure recited in each claim.

It is to be understood that the embodiments herein are illustrative and not restrictive, since the scope of the disclosure is defined by the appended claims rather than by the description preceding them, and all changes that fall within metes and bounds of the claims, or equivalence of such metes and bounds thereof are therefore intended to be embraced by the claims.

The invention claimed is:

1. A method for manufacturing a laser scanning unit, the laser scanning unit including:
   a support body being an integrally molded member made of a synthetic resin, and having a vertical wall portion in which a through-hole is formed;
   a semiconductor laser element having a flange portion protruding outwardly from a body portion thereof;
   a substrate; and
   a collimator lens,
   the method comprising:
   press-fitting the flange portion, with a front face of the semiconductor laser element serving as a leading head, into an externally-contacting hole portion of the through-hole in the vertical wall portion from a first face side of the vertical wall portion, the externally-contacting hole portion being configured to come into contact with an outer peripheral surface of the flange portion;
   connecting a terminal on a rear face side of the semiconductor laser element to the substrate; and
   mounting the collimator lens to the support body before or after the flange portion of the semiconductor laser element is press-fitted into the externally-contacting hole portion, wherein
   the press-fitting of the flange portion into the externally-contacting hole portion is stopped at a position where an edge portion, of the flange portion, on a front face side of the semiconductor laser element rests within the externally-contacting hole portion,
   the collimator lens is mounted to the support body in a path of emitted light in front of the semiconductor laser element,
   an opening is formed in a portion, of the support body, on an opposite side to the vertical wall portion side relative to a mounting position of the collimator lens, and
   the support body is a member formed with a mold, with a position on an opposite side to the vertical wall portion side relative to the opening being set as the position for a resin flow-in gate.

2. The method for manufacturing the laser scanning unit according to claim 1, wherein
   the press-fitting of the flange portion into the externally-contacting hole portion is stopped at a position where an edge portion, of the flange portion, on the rear face side of the semiconductor laser element does not reach the externally-contacting hole portion.

3. A laser scanning unit comprising:
   a support body being an integrally molded member made of a synthetic resin, and having a vertical wall portion in which a through-hole is formed;
   a semiconductor laser element press-fitted in the through-hole in the vertical wall portion;
   a substrate which is located on a first face side of the vertical wall portion, and to which a terminal on a rear face side of the semiconductor laser element is connected; and
   a collimator lens mounted to the support body in a path of emitted light in front of the semiconductor laser element, wherein
   the semiconductor laser element has a flange portion protruding outwardly from a body portion thereof, the through-hole in the vertical wall portion includes an externally-contacting hole portion configured to come into contact with an outer peripheral surface of the flange portion, the flange portion is press-fitted in the externally-contacting hole portion of the vertical wall portion in a state where an edge portion, of the flange portion, on a front face side of the semiconductor laser element rests within the externally-contacting hole portion, a step is formed on an inner surface of the externally-contacting hole portion, the step being formed to face the edge portion, of the flange portion, on the front face side of the semiconductor laser element, an opening is formed in a portion, of the support body, on an opposite side to the vertical wall portion side relative to a mounting position of the collimator lens, and the support body is a member formed with a mold, with a position on an opposite side to the vertical wall portion side relative to the opening being set as the position for a resin flow-in gate.

4. The laser scanning unit according to claim 3, wherein an edge portion, of the flange portion, on a rear face side of the semiconductor laser element is located to the first face side of the vertical wall portion relative to the externally-contacting hole portion.

5. An image forming apparatus comprising:
the laser scanning unit according to claim 3;
an image carrier on which an electrostatic latent image is formed by laser light outputted from the laser scanning unit;
a developing device configured to develop the electrostatic latent image into a toner image; and
a transfer device configured to transfer the toner image to a sheet material.

6. A laser scanning unit comprising:
a support body being an integrally molded member made of a synthetic resin in which polycarbonate and polystyrene are mixed, and having a vertical wall portion in which a through-hole is formed;
a semiconductor laser element press-fitted in the through-hole in the vertical wall portion;
a substrate which is located on a first face side of the vertical wall portion, and to which a terminal on a rear face side of the semiconductor laser element is connected; and
a collimator lens mounted to the support body in a path of emitted light in front of the semiconductor laser element, wherein
the semiconductor laser element has a flange portion protruding outwardly from a body portion thereof,
the through-hole in the vertical wall portion includes an externally-contacting hole portion configured to come into contact with an outer peripheral surface of the flange portion,
the flange portion is press-fitted in the externally-contacting hole portion of the vertical wall portion in a state where an edge portion, of the flange portion, on a front face side of the semiconductor laser element rests within the externally-contacting hole portion, and
a step is formed on an inner surface of the externally-contacting hole portion, the step being formed to face the edge portion, of the flange portion, on the front face side of the semiconductor laser element.

* * * * *